Figure 1:
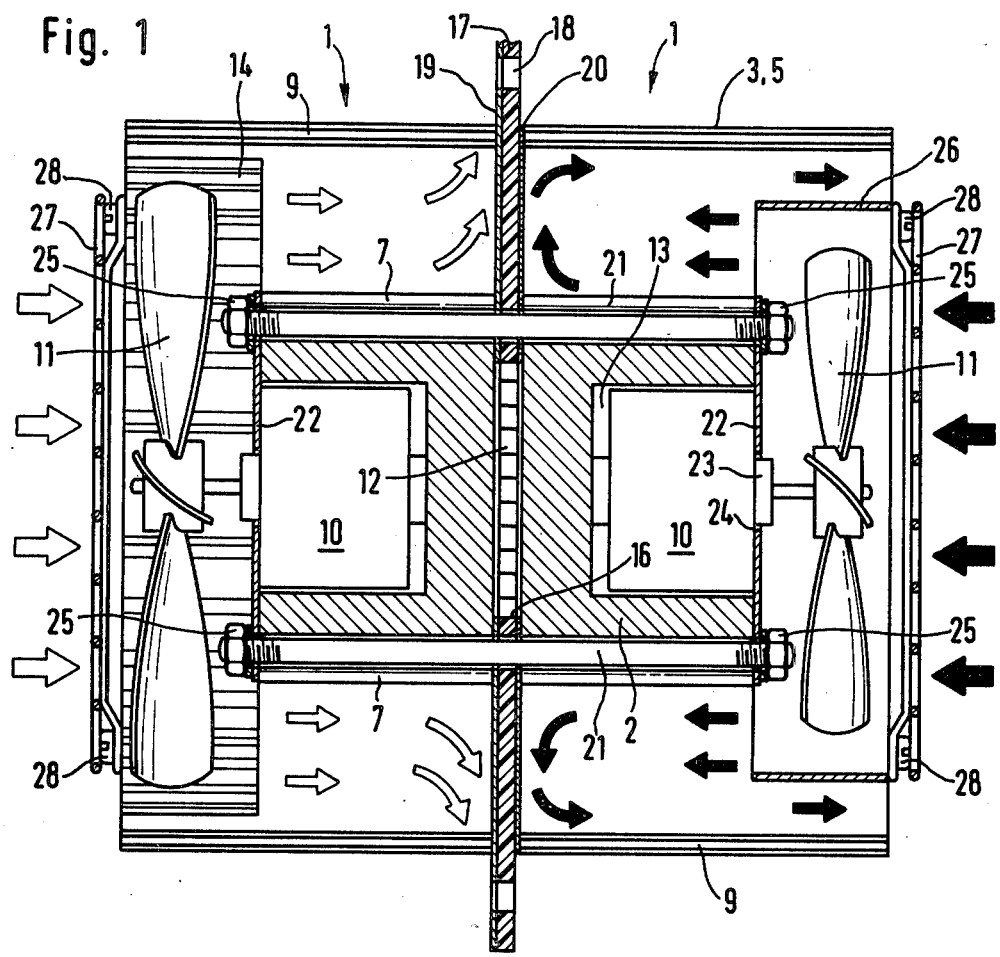

United States Patent [19]
Cech et al.

[11] Patent Number: 4,472,945
[45] Date of Patent: Sep. 25, 1984

[54] DEVICE FOR THE EXCHANGE OF COLD AND HEAT, PROCEDURE FOR ITS MANUFACTURE AND RANGE OF APPLICATION FOR THE SAME

[76] Inventors: Pavel Cech, Odenius väg 13, 443 00 Lerum; Bernt G. Hurtig, Älvsborgsgatan 33, 414 72 Göteborg, both of Sweden

[21] Appl. No.: 361,916
[22] PCT Filed: Jul. 8, 1981
[86] PCT No.: PCT/SE81/00209
§ 371 Date: Mar. 15, 1982
§ 102(e) Date: Mar. 15, 1982
[87] PCT Pub. No.: WO82/00344
PCT Pub. Date: Feb. 4, 1982

[30] Foreign Application Priority Data
Jul. 14, 1980 [SE] Sweden ................... 8005145

[51] Int. Cl.³ .............................. F25B 21/02
[52] U.S. Cl. ........................................ 62/3
[58] Field of Search .............................. 62/3

[56] References Cited
U.S. PATENT DOCUMENTS

| | | | |
|---|---|---|---|
| 2,932,953 | 4/1960 | Becket et al. | 62/3 |
| 3,100,969 | 8/1963 | Elfving | 62/3 |
| 3,186,240 | 6/1965 | Daubert, Jr. | 62/3 X |
| 3,302,414 | 2/1967 | Sudmeier | 62/3 |
| 3,681,929 | 8/1972 | Schening | 62/3 |
| 4,242,874 | 1/1981 | Simms | 62/3 |
| 4,326,383 | 4/1982 | Reed et al. | 62/3 |

Primary Examiner—Lloyd L. King

[57] ABSTRACT

A device for the exchange of cold and heat, a method for the manufacture of the device and a range of applications for the same. By means of the invention a device is obtained, which is easy to manufacture, as it lends itself to be made by extrusion and can find many different applications as for example in refrigerators. The device exhibits flanges (3, 5), which are supported by a core (2) located at the center of the device (1) and extending in the longitudinal direction of the same, said flanges (3, 5) projecting in outward direction from said core (2) and exhibiting a long extension in the longitudinal direction of the same.

7 Claims, 10 Drawing Figures

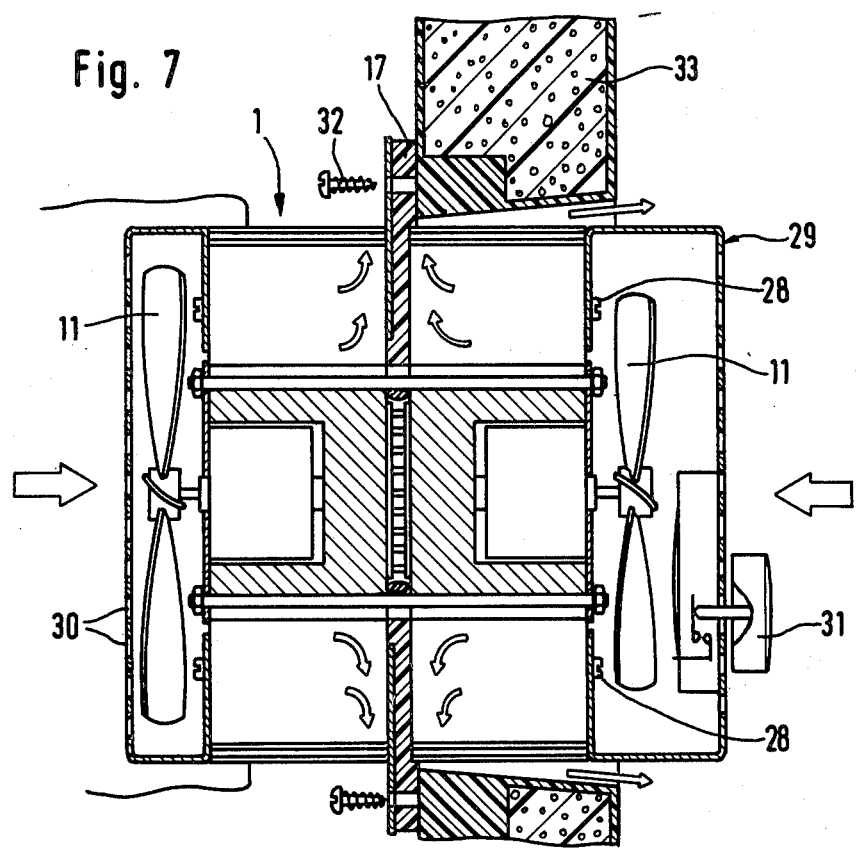
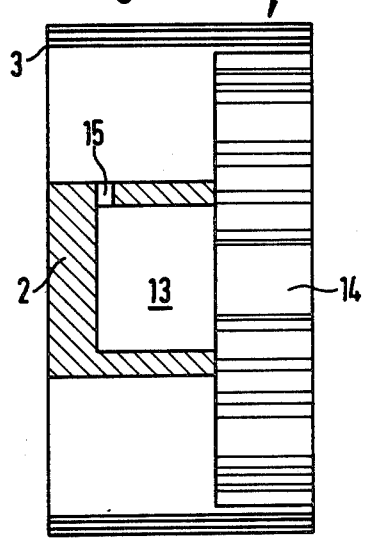
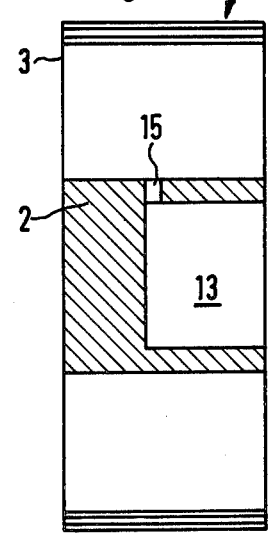
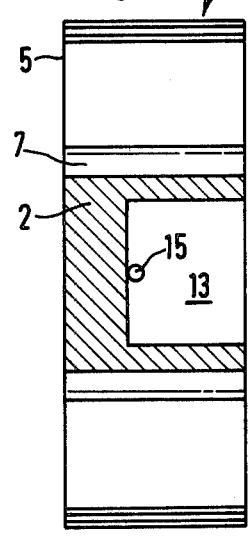

DEVICE FOR THE EXCHANGE OF COLD AND HEAT, PROCEDURE FOR ITS MANUFACTURE AND RANGE OF APPLICATION FOR THE SAME

The present invention relates to a device equipped with flanges, by means of which an exchange of cold and heat can be effected by a surrounding medium, a procedure for the manufacture of said device and the area of its application.

The principal object of the present invention is to provide a device of the kind mentioned above, which for one thing is easy to manufacture, so that it lends itself to be made by extrusion, and for another thing is simple and effective in use, as in addition to having great surfaces of its flanges it does not require complicated and expensive working operations and moreover can find varying applications within a great number of areas.

Said object is obtained by means of a device designed according to the present invention, which is substantially characterized by the flanges being supported by a core located at the center of the device and extending in the longitudinal direction of the same, said flanges extending in outward direction as counted from said core and having a shape extending in the longitudinal direction of said core.

Figure 4:
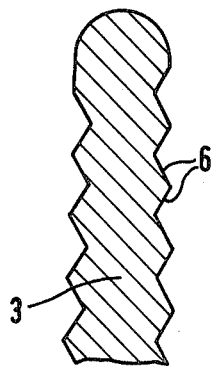
Figure 5:
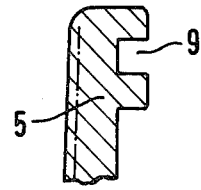
Figure 6:
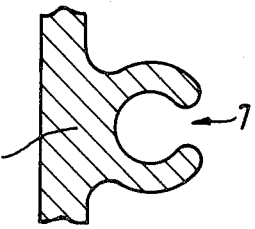
Figure 2:
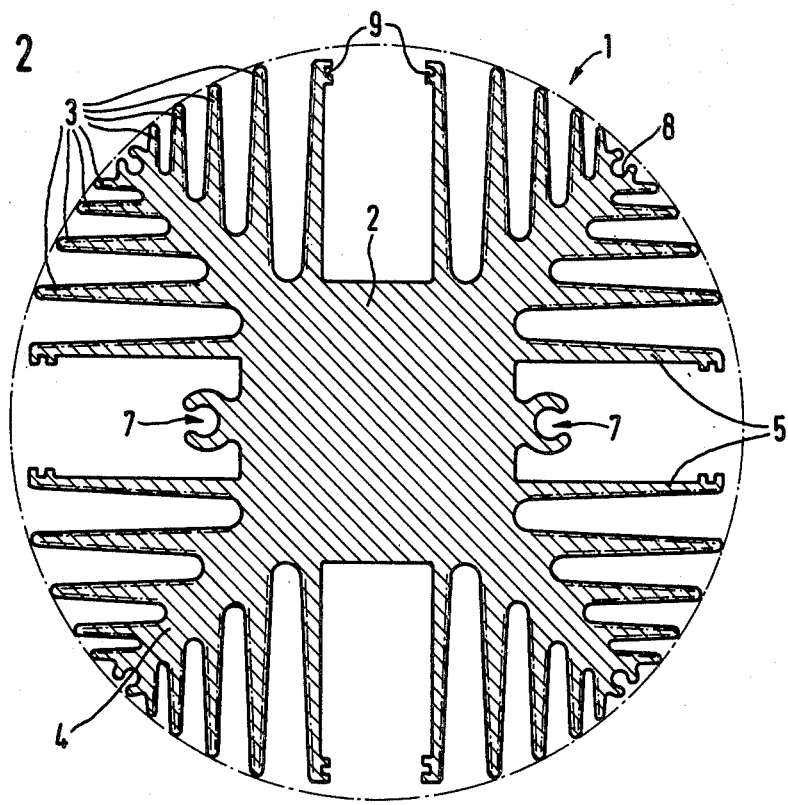
Figure 3:
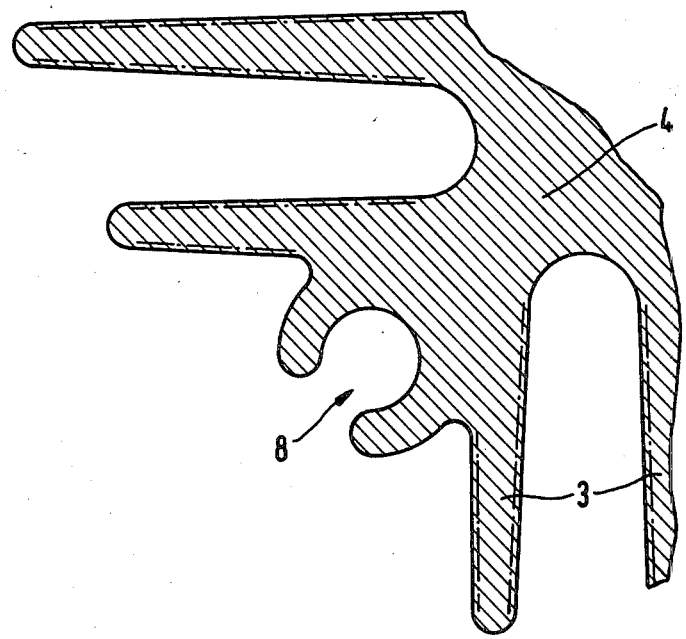

An example of embodiment of the invention will be described in the following, reference being made to the accompanying drawings, in which FIG. 1 is a view of a vertical cross-section through the wall of a refrigerator with the refrigeration unit mounted therein, said unit being among other things formed by two devices according to the invention, which have been coupled together, FIG. 2 is a cross-sectional view of the device, FIG. 3 is a cross-sectional view of an enlarged scale of a portion of the device, FIG. 4 is a cross-sectional view on an enlarged scale of a portion of a cooling and heating flange of the device, FIG. 5 is a cross-sectional view of an enlarged scale of an external flange portion of the device, FIG. 6 is a cross-sectional view on an enlarged scale of a fastening means of the device, FIG. 7 is a view of a vertical cross-section of an additional example of embodiment of the application of the device in a refrigerator, FIG. 8 is a view of a vertical cross-section through the device according to FIG. 1, FIG. 9 is a view of a vertical cross-section through the device according to FIG. 7, and FIG. 10 is likewise a view of a cross-section through the device according to FIG. 7 but along another plane than the one illustrated in FIG. 9.

A device for the exchange of cold and heat is in the FIGS. 1-10 indicated with 1, and a core located at the center of said device and extending in the longitudinal direction of the same is indicated with 2. Flanges indicated with 3 extend from said core 2 in outwards direction and have a shape of long extension in the longitudinal direction of said core 2 and the device 1. The core 2 has a substantially rectangular cross-section, preferably one of square form, and as is clearly evident from FIG. 2, it is provided with legs 4, which in outwards direction project from the center of the core 2, said legs likewise having a long extension in the longitudinal direction of the device 1. Most of said flanges 3 are supported by these legs 4 and are placed in a substantially parallel arrangement in relation to each other between two adjacent legs 4, which is also the case with flanges 5 projecting from the core 2 in the same direction.

In order to increase the contact surface of the flanges 3, 5 their laterally extending sides are provided with zig-zag formed surfaces 6 in angular arrangement, but these surfaces can of course also exhibit another design, as for example a wave form or a stepped shape.

There are two fastening means 7 each one located on its side of diametrically opposed sides of the central axis of the core 2, said means in the illustrated embodiment comprising one clasping portion 7, but it can of course be designed in a different manner and be provided with more than two fastening units. Four fastening means located right in front of each other can for example be provided on the core 2. Fastening means 8 similar to the ones just described are located at the end of each one of the four legs 4 projecting from the core, and the function and purpose of the fastening means 7, 8 will be explained below. At the ends of the flanges 5 projecting from the core 2 there are chute shaped fastening portions 9 extending in direction against each other, the function of which also will be explained below.

The device 1 described above lends itself to be manufactured of aluminum by extrusion. It is then extruded as a profile of long extension in lengths, which will subsequently be cut to a desired size, this taking place either in the factory, or when the device is mounted. The cross-section of the profile is substantially of circular shape apart from the flanges 5 of the core, which only project to the level reached by the two adjacent leg flanges 3. This arrangement serves the purpose that after the extrusion the profile will rest on a foundation being supported by said two core flanges 5 and the leg flanges 3 respectively.

There are several areas of application for the device, and it can be mentioned by way of example that the device can be used in connection with heat pumps of for example the thermo-electric kind and preferably of the type with elements producing the Peltier effect. It can then for one thing serve as supporting means for a fan motor 10 with its fan 11, as is evident from FIGS. 1 and 7 respectively, in order to among other things bring about a circulation of air past the flanges 3, 5. The device 1 also serves the purpose to offer space for the location of such a heat pump 12, which then will occupy a position in the interspace between two devices 1 placed side by side and held together tightly.

The difference between the constructions illustrated in FIGS. 1 and 7 substantially concerns the manner, in which the fan is mounted. In FIG. 1 it is shown, how the fan motors 10 and their respective fans 11 are located in the recesses 13 and 14 respectively in the respective device 1, and in FIG. 8 the form of said recesses 13, 14 is shown, and in addition also a transversal bore 15 is shown, which is provided for the wiring installation for the fan motor 10.

The device 1, which is shown in the drawing, is designed to support a thermo-electric heat pump 12, which comprises a number of thermo-electric elements 12, which are coupled together and are of the type, that produces the Peltier effect. When the device is used in refrigerators, said Peltier type elements 12 are enclosed in an opening 16 of a mounting plate 17, which has holes 18 in order to receive fastening bolts, by means of which the plate is in its turn attached to the wall of the refrigerator. Said fastening plate 17, which also serves the purpose of a gasket, in order to for example prevent that vibrations which are transmitted to the refrigerator, is formed by an insulating layer of for example polyethylene plastics, which on one of its plane surfaces, viz. the one facing away from the refrigerator and is denominated the warm side and in the drawing is seen to the left, is provided with a fastening ring 19. The other plane surface of the plate 17, which, thus, is facing the cold side, can in its turn be provided with a layer of foil 20, as is shown in the drawing.

The two units 1, each one with one of its ends facing the other, are kept together by means of rods 21 of long extension and at their ends provided with threads. These rods 21 pass through the fastening means 7 projecting from the core 2 and at their respective ends support fastening plates 22, which at their center are provided with an opening 24 of a size adapted to the hub 23 of the fan. After tightening of the bolts 25, the two units 1 are pressed together and thereby clamp the thermoelements 12 in between them, the units 1 being tightly pressed against the plate 17 at the same time as the fan motors 10 inserted into the recesses 13 are held by the respective fastening plate 22. The fan 11 on the warm side, which is to the left in the drawings, is received in the recess 14 of the device 1, and the fan 11 is in a corresponding manner placed in a similar recess 13 on the cold side of the second unit 1, said recess 13 besides along its periphery supporting a ring 26 for the air discharge. A protective grating 27 is provided on the side of each respective fan 11, which grating can be designed as a wire net or have any other similarly suitable form, and is held by means of screws 28 cooperating with the fastening means 8. Said screws 28 can instead be designed as rods similar to the rods 21. The grating 27 as well as the unit 1 are then held by the same common fastening elements, in which case possibly also the central rods 21 may be dispensed with.

In the embodiment shown in FIG. 7 the fans 11 are enclosed in protective hoods 29. Then only the recess 13 with the connecting wiring duct 15 needs be made in the extruded and cut-off profiled unit 1. Expensive working operations can thereby be avoided. In a manner similar to the one, in which the gratings 27 of the previous embodiment are held, the hoods 29 are attached by means of screws 28 or other suitable fastening means cooperating with the fastening means 8 of the respective unit 1. Air inlet openings 30 are made at the ends of said hoods 29, and one hood 29 also supports a thermostat 31 on its cold side.

A device 1 according to the description above and by means of screws 32 fastened to a refrigerator wall 33 functions as follows. The Peltier elements 12 are connected with an electric power source in an in itself known manner, so that a current flows through the same and produces the cooling of one unit 1, viz. the cold one, and a warming up of the other unit 1, viz. the warm one. When the predetermined temperature has been reached, the thermostat 31 cuts off the current supply to the elements 12, whereas the circuit again is closed, when the thermostat 31 senses that the temperature is rising. The air, which by actuation of the fans 11 flows in past the fan blades 11, gives rise to a heat transfer between the units 1 and the air, as is shown by the arrows in FIGS. 1 and 7 respectively, whereby said units 1 are cooled off. The air on the warm side is at an angle of 90° deflected towards the plate 17, 19, 20 and subsequently flows in radial direction between the flanges 3, 5, whereas the air on the cold side is deflected over substantially 180° and in substantially axial direction is conducted backwards along the flanges 3, 5 outside of the ring 26.

In the embodiments described the invention is applied to refrigerators. However, the invention can also find an application in storage spaces for warm-keeping purpose or for dehumidification of ventilating installations, if the insulating plate 17–20 is omitted and the unit is mounted in a tube, whereby an air passage parallel to the axis of the whole device is obtained. One of the fans can then be dispensed with. A warming-up effect instead of cooling can be obtained by reversing the polarity of the Peltier elements.

The fastening means 9 on the core flanges 5 serve the purpose to receive a plate-shaped porton, by way of example designed to support a thermostat or in order to form the wall of a wiring duct, by which arrangement the wires to the fan motors and other wires will be effectively protected from the fans 11.

The invention is not limited to the embodiment described above and illustrated in the drawings by way of example only, but can be varied as to its details within the scope of the following claims. Other cross-sections and arrangements of the flanges than the ones shown can of course be chosen, and the manner, in which the units are fastened can likewise be varied. The fastening ring 17–20 shown in the drawing can by way of example be made of a selfsupporting material such as for example sandwich laminate of polyurethane, polyvinyl chloride or other material with a low value of heat transfer. A greater range of possibilities to chose the mounting arrangement of the device is then obtained, as it can take place from the inside as well as the outside of the wall of the space, in which the device shall be used.

We claim:

1. In combination: a first device having a core having a major extension in one direction, and a plurality of flanges extending outwardly from said core transverse to said one direction and also having their major extension in said one direction, said flanges extending substantially over the whole circumference of said core, a fan motor supported in said core and having a fan causing air to circulate past said flanges in said one direction, a heat pump supported at said core spaced in said one direction from said fan motor and having heat pump elements extending transverse to said one direction, and a second device having a core with a major extension in said one direction, and a plurality of flanges extending outwardly from said core of said second device transverse to said one direction and also having their major extension in said one direction, said flanges extending substantially over the whole circumference of said core of said second device, a fan motor supported at said core of said second device and having a fan for causing air to circulate past said flanges of said core of said second device opposite to said one direction.

2. In combination, a first device comprising: a core having a major extension in one direction, and a plurality of flanges extending outwardly from said core transverse to said one direction and also having their major extension in said one direction, said flanges extending substantially over the whole circumference of said core, means at said core for supporting a fan motor for causing air to circulate past said flanges in said one direction, and means at said core for supporting a heat pump transverse to said one direction, and a second device coupled to said first device.

3. The combination according to claim 2, wherein said core has a substantially square cross section transverse to said one direction and has supporting legs respectively located at the corners of the cross section and extending outwardly in radial direction from the center of the core.

4. The combination according to claim 3, wherein said flanges include first flanges projecting outwardly from the legs parallel to each other, and second flanges projecting outwardly from said core and parallel to each other, the length of the first flanges decreasing with their distance from the center of the core.

5. The combination according to claim 4, wherein the cross section of the first device is substantially circular, and including fastening means at said core and extending parallel to said one direction.

6. The combination according to claim 4, wherein said cross section of said first device is circular, and comprising fastening means at some of said flanges.

7. The combination according to any one of claims 2 to 6, wherein the surfaces of said flanges in said one direction are wave-shaped, tooth-shaped or zig-zagged shaped.

* * * * *